United States Patent [19]

Chevrel et al.

[11] Patent Number: 4,808,488
[45] Date of Patent: Feb. 28, 1989

[54] HYBRID SUPERCONDUCTIVE WIRES OR RIBBONS COMPRISING A CHEVREL PHASE AND ANOTHER SUPERCONDUCTIVE PHASE

[75] Inventors: Roger A. Chevrel, Vignoc; Marcel M. Sergent; Maryvonne F. Hirrien, both of Rennes, all of France

[73] Assignee: Centre Nationale de la Recherche Scientifique (CNRS), Paris, France

[21] Appl. No.: 52,931

[22] Filed: May 22, 1987

[30] Foreign Application Priority Data

May 22, 1986 [LU] Luxembourg .................. 8607364

[51] Int. Cl.⁴ .................. H01L 39/12; H01L 39/24
[52] U.S. Cl. .................. 428/614; 29/599; 148/11.5 F; 148/11.5 P; 174/125.1; 419/4; 428/615; 428/558; 505/887
[58] Field of Search .................. 428/614, 615, 558; 148/11.5 F, 11.5 P; 29/599; 174/128 S; 419/4

[56] References Cited

U.S. PATENT DOCUMENTS

| 2,195,199 | 3/1980 | Hillmann et al. | 29/599 |
| 4,531,982 | 7/1985 | Dubots et al. | 148/11.5 F |
| 4,575,927 | 3/1986 | Braginski et al. | 29/599 |
| 4,629,515 | 12/1986 | Imaizumi et al. | 148/11.5 P |
| 4,704,249 | 11/1987 | Glatzle | 419/4 |

FOREIGN PATENT DOCUMENTS 0138719 4/1985 European Pat. Off. .
0171918 2/1986 European Pat. Off. .

OTHER PUBLICATIONS

Luhman et al., Jour. Appl. Phys. 49 (1978) 936.
"New Superconducting Ternary molybdenum Chalcogenides $InMo_6Se_8$, $T1MO_6S_8$, and $T1Mo_6Se_8$", Physical Review B. Condensed Matter, vol. 29, No. 1, 1984, pp. 172-180.

*Primary Examiner*—Upendra Roy
*Attorney, Agent, or Firm*—Cushman, Darby & Cushman

[57] ABSTRACT

A hybrid superconductive fiber or strand comprises at least two layers surrounding a core wherein the fiber or strand comprises two superconductive materials. One of the superconductive materials is a Chevrel phase, optionally doped, which constitutes one of the layers or the core. The other superconductive material, other than the Chevrel phase, constitutes another layer, optionally lacunar, or the core.

6 Claims, 1 Drawing Sheet

HYBRID SUPERCONDUCTIVE WIRES OR RIBBONS COMPRISING A CHEVREL PHASE AND ANOTHER SUPERCONDUCTIVE PHASE

The present invention relates to new superconductor hybrid wires or ribbons and to their preparation, as well as to multifilamentary wires which are produced with the said hybrid wires.

It is known that certain metals have superconductive properties at low temperature, but that they are difficult to use in the production of magnets since their superconductive state disappears when the magnetic field is raised.

Various superconductor materials are known which are capable of supporting intense magnetic fields.

Representative ones of these superconductors include, for example:

(1) materials of the $M_3M'$ type, wherein M represents at least one metal selected from niobium and vanadium, and M' represents at least one metal selected from aluminum, gallium, germanium, tin, indium and silicon.

These materials are generally designated by the name "A-15 phases" and are described, for example, by D. Dew-Hughes, "Superconducting A-15 compounds: A review", Cryogenics, August 1975, pages 435-454;

(2) "Laves phases" or "C-15 phases" which are compounds having the formula $M''V_2$, wherein $M''$ is at least one metal selected from hafnium and zirconium; the Laves phases and their properties being described principally by K. Tachikawa, in "Superconductor Materials Science", edited by Simon Foner and Brian B. Schwartz, Plenum Press (1981), pages 855-856;

(3) Nb-Ti alloys (or $A_2$ type alloys) containing, for example, from 40-55 weight percent of titanium; these alloys, which can also contain other metals such as tantalum, zirconium, etc., and their superconductive properties are described, for example, by D. C. Larbalestier, in "Superconductor Materials Science", op. cit., pages 133-199; and (4) "Chevrel phases" which are compounds having the formula $M_x'''Mo_{6+y}X_8$, wherein $M'''$ is at least one metal selected from alkali metals, alkaline earth metals, copper, zinc, silver, cadmium, mercury, indium, thallium, tin, lead, aluminum, gallium, bismuth, antimony, scandium, yttrium, the lanthanides and the actinides; x ranges from 0 to 4, X represents a chalcogen (sulfur, selenium or tellurium); y represents a variation of the stoichiometry which can range from 0 to 0.5, it being understood that a portion of the chalogens can be substituted by bromine or iodine.

The concentration, x, of the $M'''$ element depends principally on the size of the ion of this element. Representative known Chevrel phases include, principally, the following compounds: $PbMo_6S_8$, $SnMo_6S_8$, $Cu_x$-$Mo_6S_8$, $Mo_6S_8$, $Mo_6Se_8$, $LaMo_6S_8$, $LaMo_6Se_8$, $AgMo_6S_8$, $TlMo_6Se_8$, $Mo_6S_6Br_2$, $Mo_6S_6I_2$, etc.

Besides, in the Chevrel phases, molybdenum can be partially replaced (for example in amounts ranging up to 10 atom percent) by at least one metal selected from Nb, Ta, W, Re, Ru, Rh, etc.

The Chevrel phases can also include, in a known manner, dopants such as tin, aluminum, niobium, silicon, gallium, silver, lead, etc.

The Chevrel phases can be elaborated, in a known manner, starting with the following binary compounds or elements: sulfur, molybdenum, $M'''$ metal, metal dopants, and/or $M'''S_n$ sulfides (n being a number equal to the moiety of the valence of $M'''$), $MoS_2$ and/or $Mo_2S_3$ and/or sulfides of the dopant elements, in an amount suitable for the production of the Chevrel phase having the desired composition belonging to the field of existence of Chevrel phases in the phase diagram at the considered reaction temperature.

The Chevrel phases and their superconductive properties are described principally in "Topics of Current Physics", Vols. 32 and 34, Superconductivity in Ternary compounds I and III, edited by O. Fischer and M. B. Maple, Springer-Verlag (1982).

The superconductors based on the Chevrel phase are potentially interesting since the critical current density curves, as a function of the applied field, show that one obtains relatively high values are obtained for critical current density, with an extremely weak variation, at high field.

Actually, the A-15 phases, niobium-titanium alloys and the Laves phases have higher current densities but are useful only in an average field.

It is known that the superconductor materials are employed principally in the form of composite wires or ribbons generally combined into multifilamentary wires; see, for example, R. Chevrel and M. Sergent, Innov. Tech. Biol. Med., Vol. 5, pages 516-526 (1984).

The individual superconductor wires generally include a copper sheath, because copper is a good heat conductor and permits easy removal of heat produced by sudden transitions to the conductor state which can be produced locally in coils made with superconductor filaments.

For use at high field, it is also possible to reinforce the wire with a supplementary external or outer sheath supporting indeed mechanical strains, for example, stainless steel.

A disadvantage of copper is that it has a tendency to migrate in the Chevrel phases and to reduce or cause a deterioration of the superconductive properties. Also, various protection tests by a metallic sheath of the Chevrel phase have been effected.

The use of superconductors based on Chevrel phases poses, however, technical problems difficult to resolve, for even the wires provided with metallic sheaths or barriers separating the Chevrel phase from one copper sheath are not satisfactorily disclosed; see, for example, Thomas Lukman et al, J. Appl. Phys. 49 (2), 936-938 (1978).

It has now been discovered that the questionable results observed with composites based on the Chevrel phases are due, in part, to the formation of resistive barriers at the Chevrel phase sheath interface.

Another disadvantage of Chevrel phases, is that the current density at low field is relatively weak.

Figure 1:
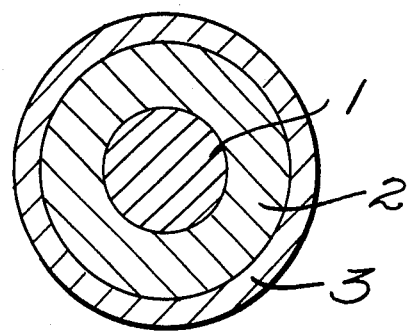
FIG. 1 is a sectional view of the tube (billet) prepared in Example 1.
Figure 2:
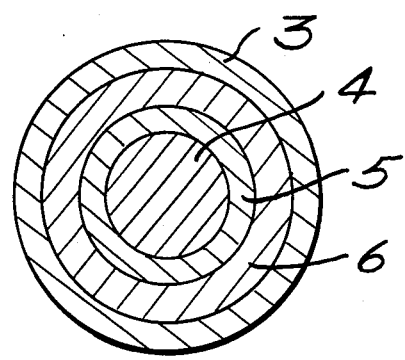
FIG. 2 is an elongated sectional view of the corresponding finished wire.

1 denotes the Chevrel phase precursors in the tube, containing an excess of Sn; 2 denotes the Nb tube, and 3 denotes the copper tube. 4 denotes the formed Chevrel phaase core; 5 denotes the $Nb_3Sn$ layer formed at the surface of the core due to migration of Sn from the core towards 2; and 6 is the remainder of the Nb tube.

The present invention has for a purpose the production of very high current densities by Chevrel phases, even in a weak field, and the avoidance of the formation of resistive barriers during elaboration of composite filaments or strands.

This improvement has been obtained by the production of a superconductor hybrid wire combining a Chevrel phase with another superconductor phase.

The present invention thus relates to a hybrid superconductor wire or ribbon comprising at least two layers surrounding a core, characterized by the fact that the said wire or ribbon comprises two superconductor materials, that one of the superconductor materials is a Chevrel phase, optionally doped, and constitutes one of the layers or the core and that the second superconductor material, other than the Chevrel phase, comprises another layer, optionally jacket or sheath, or the core.

In particular embodiments of the present invention, the hybrid superconductor wire or ribbon can also have the following characteristics, taken singly or in combination:

(a) one of the two superconductor materials, for example, the Chevrel phase, constitutes the core;

(b) the two superconductor materials are in contact with one another;

(c) the second superconductor material is selected from an A-15 phase, a Laves phase or an Nb-Ti type alloy; and (d) the ratio of the thickness of the second superconductor material and the Chevrel phase is lower than 15%.

However, when one of the superconductive phases constitutes the core, the other superconductive phase constitutes one of the layers surrounding the core, and the other layer necessarily present is either a barrier between the two superconductive phases, or an external or outer copper sheath constituting a third layer, or again a barrier between the most external or outer superconductive phase and an external copper sheath constituting a fourth layer.

The present invention also relates to a process for preparing a hybrid wire or ribbon as defined above. This process is mainly characterized by the fact that there is disposed, in a known manner, the constitutive layers of the wire or ribbon, it being understood that the core (or the superconductive layers) containing the superconductor is already elaborated, or in the form of precursors of said superconductor, that the disposed layers are optionally compacted, and that, if desired, the disposed layers are subjected to conventional operations of extrusion, drawing and wire drawing or laminating to obtain a wire or ribbon of reduced section. The resulting product is then subjected to a thermal treatment, in a manner known in itself, to restore superconductivity and, the case happening, to elaborate the superconductor(s).

In a general manner, the materials employed, and in particular thethe precursors of the superconductor phases, must have a sufficient purity. The amount of impurities (and in particular of 3d magnetic metals) must at least be lower than 100 ppm.

In particular embodiments of the present invention, the process of the invention can also exhibit the following characteristics, taken singly or in combination:

(i) the precursors of the superconductor material are distributed in two adjacent layers; or in the core and the immediately adjacent layer;

(ii) there is added to the Chevrel phase or to its precursors, one of the precursors of the other superconductor, the remaining precursors of said other superconductor being present in an adjacent layer or, the case happening, in the core adjacent to the Chevrel phase;

(iii) there is added to the Chevrel phase, or to its precursors, a precursor of the other superconductor, this precursor being selected from silicon, aluminum, germanium, gallium, indium, tin, hafnium, zirconium and titanium, or optionally their corresponding sulfides;

(iv) one precursor of one of the superconductors is a precursor capable of reacting with an adjacent layer containing niobium or vanadium, so as to form an A-15 phase; the said precursor is selected, for example, from one based on silicon, aluminum, germanium, gallium, indium or tin;

(v) one precursor of a superconductor is a precursor capable of reacting with an adjacent layer containing vanadium to form a Laves phase; for example, the said precursor is selected from hafnium and zirconium;

(vi) one precursor of a superconductor is based on titanium which gives with an adjacent layer containing niobium an alloy of the niobium-titanium type; and (vii) the said wire or ribbons comprises an external or outer layer made from a copper-tin alloy, and the tin reacts with an adjacent internal or inner layer containing niobium to form a superconductive $Nb_3Sn$ layer.

In a general fashion, the Chevrel phase (or its precursors) used as a starting product and optionally the additive mixed to the Chevrel phase, is in the form of a powder (optionally compacted) having a granulometry lower than 40 micrometers, and preferably lower than 20 micrometers.

The thermal treatment carried out at the end of the process on the resulting wire or ribbon has for a purpose to restore superconductivity (in the case of a starting product containing a superconductive phase, for example, a Chevrel phase, already formed) and optionally to elaborate the superconductive phase (for example the Chevrel phase) by reaction between the precursors thereof. The resulting wire or ribbon will be heated to a temperature generally lower than 1000° C., principally between 600° and 1000° C., in one or more stages. The temperature selected depends on the nature of the starting mixture, the additive and the barrier. The heating time can be determined experimentally in a simple manner, in each case, by selecting the duration that gives the best superconductive properties of the wire or ribbon prepared.

There is now described in detail, as an illustration only, an embodiment of the process of the invention consisting in forming a superconductive phase in contact with a Chevrel phase.

The process of the invention presents numerous advantages, principally in the case where there is formed, in situ, a second superconductive phase at the interface of the Chevrel phase and of the adjacent layer. It has been noted that even if the second superconductive phase is lacunar, that is to say, if the superconductive film does not entirely cover the Chevrel phase, interesting improvements of the critical current density are obtained.

In accordance with a particular embodiment, to produce the second superconductive layer at the surface of the Chevrel phase, the Chevrel phase (or its precursors) in powder form is mixed with an additive, also in powder form, which is one of the precursors of the second superconductive phase that is desired to be elaborated. However, the mixtures of powders must be homogeneous. The additive, however, can only be applied at the Chevrel phase-barrier interface.

The additive, a precursor of the second superconductive phase, is added to the Chevrel phase, for example, in the form of the element itself, or in the form of the corresponding sulfide, and in this latter case the composition of the precursors of the Chevrel phase must take into account the additional sulfur introduced by the additive, since, as is well known to specialists, any excess sulfur in the Chevrel phase is generally harmful.

It is necessary to remark that the possibilitty of obtaining a superconductive phase by diffusion with a precursor and reaction or mixture with other precursors present in an adjacent layer constitutes an unexpected characteristic of the process of the invention. For example, in the case of a Chevrel phase which contains a precursor additive (such as tin) of an A-15 phase and which is surrounded by a niobium sheath, there has effectively been observed that there is formed at the interface a film of definite composition $Nb_3Sn$ (A-15 phase) despite the presence of an excess of niobium; in other words, in this case there is obtained a composite having the following structure: Chevrel phase/A-15 phase/niobium.

The normal expectation would be that the niobium would diffuse into the Chevrel phase and form atthe interface, for example, a niobium sulfide which would consitute an undesirable resistive barrier.

However, the thickness of the niobium barrier and the amount of tin in the Chevrel phase can be selected in a manner such that the amounts of niobium and tin correspond essentially to the composition, $Nb_3Sn$, and in this case the composite obtained would have the structure Chevrel phase/A-15 phase without that there remaining, in an appreciable manner, a barrier of niobium in excess. It is necessary to note that the presence of a barrier of niobium in the final composite does not harm the superconductive properties and can even prove interesting, for it opposes the diffusion of the copper of the external sheath toward the Chevrel phase.

One advantage of the process of the present invention is to provide the formation in situ, at the Chevrel phase-metallic barrier interface, of a superconductive phse (A-15, Laves phase, Nb-Ti type alloy).

The interest is principally to obtain a very suitable interface, without pollution or oxidation of the barrier by the sulfur, and thus to produce a truly "active" barrier. Besides, the additive, in particular when it is a question of a metal having a low melting point, permits to partially sinter the grains of powder of the Chevrel phase, and to ensure thus a very good electric contact. Moreover, in the case where the additive is more oxidizable than the constituents of the Chevrel phase, it provides for the purification of the Chevrel phase by trapping the oxygen, adsorbed at the surface of the powders, in the form of oxides which create between the grains of the Chevrel phase pinning centers of the lines of flux. The interest in such pinning centers is well known (see, for example, the article by Chevrel and Sergent cited above).

All these advantages of the process of the present invention provide superconductive composite wires or ribbons having exceptional characteristics, and make possible, for the first time, the industrial use of Chevrel phases whose interest up to now was essentially only theoretical in nature.

The present invention also relates to the use of, as an additive, in a Chevrel phase, or in a mixture of Chevrel phase precursors, an element or sulfide selected to be a precursor of a superconductive phase. The additive is selected, as described above. In a manner to elaborate, in situ, at the interface of the Chevrel phase and an appropriately selected barrier, a superconductive phase other than a Chevrel phase. The amount of additive will be adjusted as a function of the desired extent of transformation, i.e. complete transformation, or partial transformation of the barrier into a superconductive phase.

The present invention also relates to a multifilamentary wire characterized by the fact that it comprises an aggregate of hybrid wires such as defined above. These multifilamentary wires are prepared in a known manner.

The following nonlimiting examples illustrate the present invention.

EXAMPLE 1

Powders of the precursors of a Chevrel phase are mixed together, the mixture having the following composition (molar proportions):

1.05 PbS; 0.2 SnS; 3.375 $MoS_2$ and 2.925 Mo.

The additive is tin sulfide.

The powders have a granulometry lower than 20 micrometers.

It has been verified that this mixture provides at an appropriate temperature a Chevrel phase having the following composition: $Pb_{1.05}Mo_{6.3}S_8$, with 0.2 Sn as additive.

The mixture of powders, not prereacted, is compressed in a niobium tube having an inner diameter of 6 mm and an outer diameter of 12 mm. The said cylinder is itself inserted into a copper tube (called billet) having an inner diameter of 12 mm and an outer diameter of 14 mm.

The billet is sealed under a vacuum.

On cold extrusion, drawing and wiredrawing, in accordance with conventional methods, this composite assembly provides a wire having a diameter of 0.5 mm.

This wire is submitted to a thermal treatment at 950° C. for 4 hours in a manner to elaborate the Chevrel phase, and an A-15 phase ($Nb_3Sn$) at the Chevrel phase-niobium interface.

The properties of the resulting wire, measured in accordance with the resistive method, are compared to those of a wire obtained in an analogous manner but without addition of tine to the Chevrel pahse and set forth in Table 1, below.

TABLE 1

| Applied field (Tesla) | Critical Current Density ($A/m^2$) | |
|---|---|---|
| | with addition of tin | without addition of tin |
| 3 | $4.5 \times 10^8$ | $7 \times 10^7$ |
| 7 | $2.7 \times 10^8$ | $3.4 \times 10^7$ |
| 9.2 | $2 \times 10^8$ | $2.5 \times 10^7$ |

These results can be improved by compacting the starting powder, which in the present case is simply compressed.

It has been verified that there was indeed formed an A-15 phase ($Nb_3Sn$) at the Chevrel phase-niobium interface.

A test to determine the critical current density, in accordance with the resistive method, at an applied field of 20 Tesla, has shown that the critical current density was in the order of $10^8 A/m^2$.

EXAMPLE 2

The mixture of starting powders (precursors of the Chevrel phase+additive) has the following composition:

1.4 SnS; 3.3 MoS$_2$; 3 Mo.

This mixture provides a Chevrel phase having the following composition: SnMo$_{6.3}$S$_8$, with 0.4 Sn as additive.

A composite wire, having a diameter of 0.3 mm, was prepared in a manner analogous to that described in Example 1.

The thermal treatment consisted of a treatment at 750° C. for 44 hours, followed by a treatment at 900° C. for 15 hours.

The characteristics of the resulting wireZ are set forth in Table 2, below.

TABLE 2

| Applied field in Tesla | Critical Current Density (A/m$^2$) |
| --- | --- |
| 3 | $2.7 \times 10^8$ |
| 7 | $1.7 \times 10^8$ |
| 9.2 | $1.3 \times 10^8$ |

EXAMPLE 3

In an analogous manner, starting with a mixture of the presursors of a Chevrel phase together with a titanium additive and with a niobium barrier, the whole being inserted in a copper sheath, a composite wire was produced with the formation of at the Chevrel phase-niobium interface, a superconductive film of Nb-Ti alloy.

EXAMPLE 4

In an analogous manner, starting with a mixture of Chevrel phase precursors containing zirconium as an additive, with a vanadium barrier, the whole being inserted in a copper sheath, a composite wire was produced with the formation of, at the Chevrel phase-vanadium interface, a Laves phase ZrV$_2$.

What is claimed is:

1. A hybrid superconductive wire or ribbon comprising at least two layers surrounding a core wherein said wire or ribbon comprises two superconductive materials, one of said superconductive materials being a Chevrel phase and the other of said superconductive materials being different from a Chevrel phase, and wherein each of said superconductive materials constitutes one of said layers, or one of said superconductive materials consitutes the core, and the other of said superconductive materials constitutes one of said layers.

2. The hybrid superconductive wire or ribbon of claim 1 wherein said two superconductivd materials constitute two adjacent layers, or constitute said core and an immediately adjacent layer.

3. The hybrid superconductive wire or ribbon of claim 1 wherein one of said superconductive materials comprises said core.

4. The hybrid superconductive wire or ribbon of claim 1 wherein said Chevrel phase comprises the core.

5. The hybrid superconductive wire or strand of claim 1 wherein said superconductive material, other than said Chevrel phase, is an A-15 phase, a Laves phase or a Nb-Ti type alloy.

6. Multifilamentary wire comprising a plurality of the hybrid wires of claim 1.

* * * * *